United States Patent [19]

Jargiello

[11] 4,233,390

[45] Nov. 11, 1980

[54] LITHOGRAPHIC PRINTING PLATE HAVING DUAL PHOTOSENSITIVE LAYERING

[75] Inventor: Paul Jargiello, Orange, N.J.

[73] Assignee: Polychrome Corporation, Yonkers, N.Y.

[21] Appl. No.: 58,976

[22] Filed: Jul. 20, 1979

Related U.S. Application Data

[63] Continuation-in-part of Ser. No. 839,967, Oct. 6, 1977, abandoned.

[51] Int. Cl.² ................. G03C 1/52; G03C 1/76; G03C 1/68
[52] U.S. Cl. ................. 430/156; 430/273; 430/278; 430/302; 430/502
[58] Field of Search ............. 430/155, 156, 302, 273, 430/278, 502

[56] References Cited

U.S. PATENT DOCUMENTS

| | | | |
|---|---|---|---|
| 3,178,283 | 4/1965 | Millard et al. | 430/156 |
| 3,203,802 | 8/1965 | Burg | 96/115 P |
| 3,395,014 | 7/1968 | Cohen | 96/115 P |
| 3,462,267 | 8/1969 | Giangualano et al. | 96/33 |
| 3,586,507 | 6/1971 | Burnett | 430/156 |
| 3,622,331 | 11/1971 | Da | 430/156 |
| 3,652,272 | 3/1972 | Thomas | 430/156 |
| 3,808,004 | 4/1974 | Thomas | 96/68 |
| 3,879,204 | 4/1975 | Gervay | 96/115 P |
| 3,905,815 | 9/1975 | Bonham | 96/68 |
| 4,058,443 | 11/1977 | Murata et al. | 96/115 P |

*Primary Examiner*—Mary F. Downey

[57] ABSTRACT

A method for preparing aluminum based lithographic printing plates which comprises treating at least one surface of an aluminum base sheet with lithographically suitable, photosensitive, preferably water-soluble, diazo composition and then applying to said surface a lithographically suitable photopolymerizable composition to yield the desired photosensitive lithographic printing plate of improved characteristics.

7 Claims, No Drawings

LITHOGRAPHIC PRINTING PLATE HAVING DUAL PHOTOSENSITIVE LAYERING

CROSS REFERENCE TO RELATED APPLICATION

This application is a continuation-in-part of co-pending U.S. application Ser. No. 839,967 filed Oct. 6, 1977 now abandoned.

BACKGROUND OF THE INVENTION

This invention related to a novel method for the production of presensitized lithographic printing plates and to the novel lithographic printing plates produced thereby. More particularly, this invention related to a novel method of producing aluminum based photosensitive lithographic printing plates which comprises coating at least one surface of an aluminum base sheet with a lithographically suitable, light-sensitive diazo composition, and finally applying to said surface a lithographically suitable photopolymerizable coating to yield the desired photosensitive lithographic printing plate.

It is well recognized that the substantial majority of photosensitive lithographic printing plates now produced are made from an aluminum based sheeting. This aluminum sheeting has, over the years, been found to suffer from certain disadvantages which prevent the direct application of the light-sensitive coating to the aluminum base sheet. It has been found that upon direct application of the light-sensitive composition to the aluminum base sheet, and subsequent exposure thereof to light, and the removal of the non-imaged areas for the preparation of a lithographic printing plate, the resultant printing plate has many undesirable characteristics which render it unacceptable for commercial use in the printing industry. Among the disadvantages suffered by such plates can be included the fact that the removed non-image areas do not possess sufficient hydrophilic and oleophobi characteristics, and therefore on printing will pick up background imperfections which will be imprinted on the final copy. In addition, since the aluminum is a rather soft metal, it does not have the resistance properties to sustain long press runs where more than about 100,000 copies are required. Further, the characteristic of the aluminum surface is such that a problem is encountered in achieving a strong bond between the light sensitive composition and the aluminum base sheet thus causing the image area of the plate to be dislodged from the surface, and renders the printed copy imperfect.

Heretofore, in the production of metal presensitized lithographic printing plates, it had been found beneficial to treat the surface of the metal substrate sheet, with a protective interlayer substance which imparts beneficial characteristics to the final lithographic printing plate thus produced. The prior art teaches that it is desirable to treat the metal sheet substrate surface receiving the light sensitive coating material, which when exposed to light and developed becomes the printing surface of the printing plate, with an undercoating substance that forms a strong bond with the metal sheet substrate and with the light sensitive coating material.

Many such undercoating treatments are known in the art for manufacturing longer running lithographic plates, and can be used on the sheets of this invention. U.S. Pat. Nos. 3,160,506, 3,136,636, 2,946,683, 2,922,715, disclose a variety of suitable materials for undercoating bonding substances onto plates and methods for applying them. Alkali metal silicate, silici, acid, alkali zirconium fluoride and hydrofluozirconic acid solutions presently are the most important commercial bonding substances. Those materials substantially improve the bonding of the light sensitive coating to the underlying metallic base which otherwise generally tends to have inadequate affinity for the coating. Of the various known bonding mterials, the Group IV-B metal fluorides, the alkali metal salts and the acids thereof are preferred. In particular, the alkali zirconium fluorides, such as potassium zirconium hexafluoride, and hydrofluozirconic acid disclosed in U.S. Pat. Nos. 3,160,506 and 2,946,683 are used for preparing aluminum bases to receive a light-sensitive coating.

One method in particular which is disclosed in the Jewett et al. U.S. Pat. No. 2,714,066 issued July 26, 1955, involves the use of a silicious overcoating on the aluminum sheet surface which acts as an interlayer bonding the photosensitive composition to the aluminum sheet surface. However, it has been found that this method does not completely solve the problem of bonding strength in that the bonding between the photosensitive composition and the aluminum base sheet has been found not to be strong enough to withstand long press runs and, in addition, tends to wear out or fail over an extended period of time.

The instant invention provides a novel method of manufacturing presensitized printing plates wherein a photosensitive, lithographically suitable, preferably water-soluble diazo type composition is applied directly to the surface of a metal sheet substrate, preferably aluminum although other metals such as zinc or copper may also be employed. Said metal sheet substrate may have been previously treated in a variety of ways known in the art, such as graining, etching or anodizing treatments or may have been provided with an interlayer composition as hereinbefore mentioned. The diazo coated substrate is then subsequently coated with a photosensitive, solvent soluble, lithographically suitable photopolymerizable composition.

The resulting lithographic plate demonstrates a substantially extended shelf life, a protracted press life and improved clarity of the resultant printed image.

DESCRIPTION OF PRIOR ART

It is known in the prior art to produce lithographic printing plates by use of a diazo resin applied on a sheet of aluminum. It is also known in the prior art to produce lithographic printing plates by coating an aluminum sheet substrate with a layer of a photopolymerizable layer.

U.S. Pat. No. 3,905,815 issued to Bonham further discloses the production of a lithographic printing plate by means of a dual layer coating on an aluminum sheet. This dual layer consist of a first coating of a diazo resin and a second overcoating of a photopolymer resin. The present application discloses a novel lithographic printing plate of the general class, wherein an aluminum sheet substrate is first coated with a diazo resin and secondly coated with a photopolymerizable layer, which is patentably distinguishable over the above cited reference.

SUMMARY OF THE INVENTION

The present invention provides a lithographic printing plate comprising two photosensitive layers. The construction comprises a layer of a diazo composition applied to at least one surface of a substrate, said diazo composition having coated thereon a second layer comprising a photopolymerizable composition. The diazo compositions usable in the context of the present invention for the lower layer, may be comprised of any of the standard photosensitive diazo compostions which are well known in the art. A number of such compositions will be hereinafter described. The photopolymerizable layer is comprised of at least one ethylenically unsaturated monomeric or oligomeric compound having on the average above one and preferably above two double bonds capable of forming a high polymer by free radical initiated additional polymerization, a photoinitiator, an acrylonitrile-butadiene-styrene resin, a cellulose acetate phthalate resin, an acrylic resin, and p-phenol sulfonic acid sodium salt.

It has been found that by producing a lithographic printing plate in this manner, an extremely durable, long lasting, high resolution plate is achieved.

It is, therefore, an object of the present invention to provide an improved lithographic printing plate having an extremely long printing press life and shelf life.

It is a further object of the present invention to provide an improved lithographic printing plate which is developable by an aqueous alkali developer.

It is another object of the present invention to provide a lithographic printing plate having cleaner running characteristics and, therefore, producing sharper printed images over its lifetime.

These and other objects of this invention will be in part discussed and in part apparent upon examination of the detailed description of the preferred embodiment.

DETAILED DESCRIPTION OF THE PREFERRED EMBODIMENT

As hereinbefore mentioned, the present invention provides for a commercially acceptable, extremely long running lithographic printing plate.

As the first step in the production of the lithographic printing plate, a sheet metal substrate such as zinc, copper or most preferably aluminum and the alloys thereof, especially those aluminum compositions suitable for the manufacture of lithographic printing plates such as Alcoa 3003 and Alcoa 1100, which may or may not have been pretreated by standard pretreatments such as graining and/or etching and/or anodizing techniques as are well known in the art, and also may or may not have been treated with a composition suitable for use as an inerlayer for lithographic plates is first coated with a layer of a lithographically suitable light-sensitive, preferably water-soluble diazo composition. Said coated substrate is then treated with a stratum of a composition which comprises a lithographically suitable, photopolymerizable composition. Interlayer compositions employable in the practice of this invention include aqueous solutions of alkali silicate, silicic acid, the Group IV-B metal fluorides, polyacrylic acid, the alkali zirconium fluorides, such as, potassium zirconium hexafluoride, or hydrofluozirconic acid in concentrations of 0.5% to 20% by volume coated by spraying, brushing, dipping or other equivalent means.

Preferred diazo compounds which may be employed within the context of the present invention to form the coating layer closest to the base substrate include the following which are prepared in a method well known in the art:

The aromatic diazo compounds such as the reaction product of paradiazo diphenyl amine with para-formaldehyde,
 4-diazo-diphenylamine sulfate
 1-diazo-4-N,N-dimethylamino-benzene zinc chloride
 1-diazo-4-N,N-diethylamino-benzene zinc chloride
 1-diazo-4-N-ethyl-N-hydroxyethylamino-benzene, ½ zinc chloride
 1-diazo-4-N-Methyl-N-hydroxyethylamino-benzene, ½ zinc chloride
 1-diazo-2,5-diethoxy-4-benzoylamino-benzene, ½ zinc chloride
 1-diazo-4-N-benzylamino-benzene, ½ zinc chloride
 1-diazo-4-N,N-dimethylamino-benzene borofluoride
 1-diazo-4-morpholino-benzene, ½ zinc chloride
 1-diazo-4-morpholino-benzene-borofluoride
 1-diazo-2,5-dimethoxy-4-p-tolylmercaptobenzene, ½ zinc chloride
 1-diazo-2-ethoxy-4-N,N-dimethylaminobenzene, ½ zinc chloride
 p-diazo-dimethyl aniline, ½ zinc chloride
 1-diazo-4-N,N-diethylamino-benzene, ½ zinc chloride
 1-diazo-2,5-dibutoxy-4-morpholino-benzene sulfate
 1-diazo-2,5-diethoxy-4-morpholino-benzene, ½ zinc chloride
 1-diazo-2,5-diethoxy-4-morpholino-benzene, ½ zinc chloride
 1-diazo-2,5-dimethoxy-4-morpholino-benzene, zinc chloride
 1-diazo-2,5-diethoxy-4-morpholino-benzene, ½ zinc chloride
 1-diazo-2,5-diethoxy-4-morpholino-benzene-borofluoride
 2-diazo-1-naphthol-5-sulfonic acid, sodium salt
 1-diazo-4-N,N-diethylamino-benzene, borofluoride
 1-diazo-2,5-diethoxy-4-p-tolylmercapto-benzene, ½ zinc chloride
 1-diazo-3-ethoxy-4-N-methyl-N-benzylamino-benzene, ½ zinc chloride
 1-diazo-3-chloro-4-N,N-diethylamino-benzene, ½ zinc chloride
 1-diazo-3-methyl-4-pyrrolidino-benzene chloride, zinc chloride
 1-diazo-3-methyl-4-pyrrolidino-benzene-borofluoride
 1-diazo-2-chloro-4-N,N-dimethylamino-5-methoxy-benzene, borofluoride
 1-diazo-3-methoxy-4-pyrrolidino benzene, zinc chloride Condensation product of 4-diazo-diphenylamine sulfate and formaldehyde zinc chloride; and the diazo compositions listed on pages 201–214 of the reference volume, Light-Sensitive Systems, by Jaromir Kosar, Johh Wiley & Sons, New York 1965.

These diazos are applied at a coating weight of from about 5 to about 70 mg./sq.ft. and preferably from about 10 to about 30 mg./sq.ft.

The formulation of the novel photopolymerizable upper coating layer comprises the admixture of one or more ethylenically unsaturated monomeric or oligomeric compounds having on the average more than one and preferably more than two double bonds which is capable of forming a high polymer by free radical initiated addition polymerization, a photoinitiator capable of generating free radicals, an acrylonitrile-butadiene-styrene resis to provide a highly impact resistant printing surface, an acrylic resin which adds durability to the surface and promotes film uniformity, cellulose acetate phthalate resin which has been found to permit use of aqueous developers after exposure and p-phenol sulfonic acid sodium salt which has been found to drastically increase the shelf life of the plate. In addition to those ingredients, additional compounds may optionally be blended into the composition such as fillers, for example, fine silica, extenders, polymerization inhibitors and colorants as well known in the art. Furthermore, all the constituents are mixed with a suitable solvent system. Suitable solvents include Methyl Cellosolve (TM), which is ethylene glycol monomethyl ether, methyl cellosolve acetate, methyl ethyl ketone, n-butanol, ethylene dichloride, methylene chloride and methanol in amounts of from about 1% to about 10% of the photopolymerizable composition.

Ethylenically unsaturated monomeric or oligomeric compounds useful for this invention constitute from about 20 to about 60 percent and preferably from about 40% to about 50% by weight of the upper coating composition. Typical of such monomers and oligomers include each of the following compositions or blends thereof: Polychrome Corporation's Uvimers 530, 545, 580 and 588, which are ethylenically unsaturated urethanes and epoxies, some of which are described in U.S. Patent application Serial Number 929,155 filed July 31, 1978, polyfunctional ethylenically unsaturated epoxies, urethanes, polyesters, and polyethers, allyl acrylate, acrylic anhydride, allyl methacrylate, butanediol diacrylate, butanediol dimethylacrylate, diethylene glycol diacrylate, ethylene diacrylate, glycerol triacrylate, methacrylate anhydride, methallyl acrylate, methallyl methacrylate, pentaerythritol tetraacrylate, pentaerythritol tetramethacrylate, pentaerythritol triacrylate. These polyfunctional monomers and oligomers may optionally be blended with such monofunctional compositions as: glycidyl acrylate, glycidyl methacrylate, acrylonitrile, hydroxyethyl acrylate, methacrylic acid and methacrylonitrile methyl chloroacrylate.

The cellulose acetate phthalate useful for this invention constitutes from about 4% to about 50% and preferably from about 10% to about 25% of the upper coating composition. Particularly useful as such are Acryloid (TM) resins as homopolymers and copolymers of alkyl acrylates and methacrylates (available from Rohm & Haas). Solid polyamide resins and polyurethanes may be substituted for the acrylic resin. These resins typically have molecular weights in the range of from about 2,000 to 200,000.

Acrylonitrile-butadiene-styrene terpolymers such as are commercially available from the Dow Chemical Company, as Dow 300 and Dow ABS 500 and XP74002 may be present in the upper coating composition in an amount of from about 2% to about 25% and most preferably from about 3% to about 10% by weight. Preferred terpolymers have a molecular weight of from about 10,000 to 2,000,000 and contain about 20-30 mol percent acrylonitrile, 20-30 mol percent butadiene and 40-60% styrene although there proportions are not critical.

Preferred photoinitiators include benzophenone, Michler's Ketone and O-chlorohexacrylbiimidizole in the following percentages by weight of the coating composition either singly or in various admixed combinations:

|  | Operable Range | Preferred Range |
| --- | --- | --- |
| Benzophenone | 0.5 to 15% | 1 to 3% |
| Michler's Ketone | 0.5 to 15% | 1 to 3% |
| O-chlorohexarylbiimidzole | up to 15% | 1 to 3% |

Other useful photoinitiators include benzil, benzoin ethers, benzoin substituted ethers as disclosed in U.S. Pat. No. 3,905,815, Irgacure (available from Ciba-Geigy), Trigonal (available from the Noury Chemical Corporation, although other photoinitiators as are well known in the art may also be employed.

It has further been found that by the addition of p-phenol sulfonic acid sodium salt to the upper layer in an amount of from 0.4% to 5% and preferably 0.75% to 4% by weight, a dramatic increase in the shelf life of the plate is observed. It is believed that upon the evaporation of the coating solvents used to apply the upper layer, the p-phenol sulfonic acid sodium salt (PSA) precipitates from the composition and reacts with the diazo compound of the lower layer at the interface of the two layers. Identical plates prepared according to this invention both with and without PSA show at least a five fold increase in shelf life when PSA is present in the upper coating composition.

Colorants employable in the coating composition include all those listed in the Color Index which do not substantially interfere with the mechanism of the coating layer. Preferred colorants are dyes and most preferred are the Orasol dyes available from Ciba Geigy in amounts of from about 0.25 to about 3%, and most preferably from about 1 to 3% of the coating composition.

Exemplary polymerization inhibitors include p-methoxy phenol hydroquinone, hydroxy butylated toluene and hydroxy butylated anisole in an amount of from 0.05 to about 1% and preferably from about 0.1% to about 0.4% of the coating composition.

A typical solvent system for these ingredients is about 3 parts Methyl Cellosolve (TM) mixed with about 10 parts of methyl ethyl ketone, although a plethora of other solvent systems are employable within the context of the present invention.

The upper layer composition may preferably be coated at a weight of from about 100 to about 600 mg./sq.ft.

The formed lithographic printing plate may be exposed through a mask or transparency to ultraviolet or actinic light in a manner well known in the art, and the thus exposed plate may be developed by use of an aqueous alkaline developer, with or without wetting agents, in a manner well known to the skilled worker. After development, the plate may optionally be post exposed to said light source. This post exposure tends to increase the length of the press life of the plate.

The following is a non-limiting example which demonstrates the operation and intent of the invention.

EXAMPLE 1

A grained, anodized sheet of Aloca grade 1100 aluminum is first coated with a compound which is the reaction product of paradiazo diphenylamine with paraformaldehyde at a coating weight of 30 mg./sq.ft. The thus treated substrate is then coated with a composition which comprises:

| | |
| --- | --- |
| Uvimer 530 (ethylenically unsaturated polyurethane available from Polychrome Corp.) | 12 g |

-continued

| | |
|---|---|
| Cellulose acetate phthalate | 4 g |
| ABS-300 (available from Dow Chemical Co.) | 2 g |
| Acryloid A-21 (available from Rohm & Haas) | 6 g |
| Benzophenone | .5 g |
| Michler's Ketone | .5 g |
| Hexaarylbiimidizole | .5 g |
| p-phenol sulfonic acid sodium salt | .1 g |
| Orasol GN dye | .4 g | in a solvent system of 60 ml methyl cellosolve and 200 ml of methyl ethyl ketone at a coating weight of 500 mg./sq.ft. The thus produced lithographic printing plate was exposed through a photographic transparency on a 5KW Berkey ultraviolet light source for 40 seconds and developed with Polychrome's 982 aqueous alkali developer. The thus produced printing plate provided 200,000 acceptable reproductions.

Another sample of the thusly produced plate was subjected to accelerated shelf life testing by baking in a 60° C. oven. After six days in such an oven an acceptable plate was produced. This corresponds to a shelf life of at least five years.

Still another example of such a plate was produced except the p-phenol sulfonic acid sodium salt was not included. The plate showed only marginal commercial acceptability after only 1 day in the oven or approximately a one year shelf life.

It is, of course, to be understood that the foregoing disclosure is intended to illustrate the invention and that numerous changes in the conditions and proportions can be set forth without departing from the scope of the invention as disclosed and defined in the claims appended hereinafter.

What is claimed is:

1. A lithographic printing plate capable of development with an aqueous alkali developer which comprises a sheet substrate having coated thereon a light-sensitive, lithograhically suitable, water-soluble diazo composition, said diazo composition having coated thereon a lithographically suitable photopolymerizable composition, which photopolymerizable composition comprises the admixture of, in percent by weight of the photopolymerizable composition:
   (a) an acrylonitrile butadiene styrene resin in an amount of from 2% to 25%; and
   (b) one or more resins selected from the group consisting of solid acrylic, polyurethane and polyamide resins in an amount of from 4% to 50%; and
   (c) cellulose acetate phthalate in an amount of from 4% to 50%; and
   (d) one or more ethylenically unsaturated monomeric or oligomeric compounds having on the average, more than one double bond, and being capable of forming a high polymer by free radical addition photopolymerization, in an amount of from 20% to 60%; and
   (e) a photoinitiator capable of generating free radicals in an amount of from 0.5% to 45%; and
   (f) p-phenol sulfonic acid sodium salt in an amount of from 0.4% to 5%.

2. A lithographic printing plate of claim 1 wherein the photopolymerizable composition further comprises ingredients, in minor amounts, selected from the group consisting of colorants, polymerization inhibitors, and fillers.

3. A lithographic printing plate of claim 2 wherein the colorant is a dye, and the filler is fine silica.

4. The lithographic printing plate of claim 1 wherein the photoinitiator is comprised of an ingredient or ingredients selected from the group consisting of benzophenone, Michler's Ketone and O-chlorohexarylbiimidizole.

5. The lithographic printing plate of claim 1 wherein the photoinitiator comprises equal parts of benzophenone, Michler's Ketone and O-chlorohexarylbiimidizole.

6. The lithographic printing plate of claim 1 wherein the diazo coating weight is in the range of from 5 to 70 mg/sq.ft. and the coating weight of the photopolymerizable composition is from 100 to 600 mg./sq.ft.

7. The lithograhic printing plate of claim 1, 2, 4, or 5, wherein the diazo compound is the condensation product of paradiazo diphenyl amine with formaldehyde or paraformaldehyde.

* * * * *